US009548715B2

(12) United States Patent
Van Liempd et al.

(10) Patent No.: US 9,548,715 B2
(45) Date of Patent: Jan. 17, 2017

(54) TUNABLE IMPEDANCE NETWORK

(71) Applicant: IMEC, Leuven (BE)

(72) Inventors: Barend Van Liempd, Leuven (BE); Jonathan Borremans, Lier (BE)

(73) Assignee: IMEC, Leuven (BE)

( * ) Notice: Subject to any disclaimer, the term of this patent is extended or adjusted under 35 U.S.C. 154(b) by 351 days.

(21) Appl. No.: 14/109,717

(22) Filed: Dec. 17, 2013

(65) Prior Publication Data

US 2014/0176388 A1 Jun. 26, 2014

(30) Foreign Application Priority Data

Dec. 21, 2012 (EP) .................................. 12199058

(51) Int. Cl.
| | |
|---|---|
| *H03H 7/38* | (2006.01) |
| *H03H 7/46* | (2006.01) |
| *H03H 7/40* | (2006.01) |
| *H01Q 1/50* | (2006.01) |

(52) U.S. Cl.
CPC ............... *H03H 7/38* (2013.01); *H01Q 1/50* (2013.01); *H03H 7/40* (2013.01); *H03H 7/465* (2013.01)

(58) Field of Classification Search
CPC ........................................................ H03H 7/38
USPC ........................................................ 333/17.3
See application file for complete search history.

(56) References Cited

U.S. PATENT DOCUMENTS

| | | | |
|---|---|---|---|
| 2,274,124 A | 2/1942 | Bowley | |
| 2011/0299436 A1 | 12/2011 | Mikhemar et al. | |
| 2013/0241669 A1* | 9/2013 | Mikhemar | H04B 1/52 333/126 |
| 2013/0241670 A1* | 9/2013 | Mikhemar | H04B 1/52 333/126 |

FOREIGN PATENT DOCUMENTS

BE 426 488 A 3/1938

OTHER PUBLICATIONS

Abdelhalem, et al., "A Tunable Differential Duplexer in 90nm CMOS" *IEEE Radio Frequency Integrated Circuits Symposium* (2012): 101-104.

(Continued)

*Primary Examiner* — Stephen E Jones
*Assistant Examiner* — Scott S Outten
(74) *Attorney, Agent, or Firm* — Knobbe, Martens, Olson & Bear, LLP

(57) ABSTRACT

A tunable impedance network and a method for tuning the tunable impedance network are disclosed. In one aspect, the tunable impedance network comprises a plurality of transformers connected in series. Each transformer has a primary winding and a secondary winding. The transformers have a voltage transformation ratio of N:1 with N>1. An impedance structure, acting as a resonant circuit together with the inductance of the secondary winding, is connected at the secondary winding of each transformer. A control circuit or processor is configured to tune the imaginary part of at least one of the impedance structures so as to change its resonance frequency to mimic a reference impedance. The control circuit is further configured to tune the real part of at least one of the impedance structures so as to change its Q-factor to mimic the reference impedance.

20 Claims, 9 Drawing Sheets

(56) References Cited

OTHER PUBLICATIONS

Aoki, et al., "Distributed Active Transformer—A New Power-Combining and Impedance-Transformation Technique" *IEEE Transactions on Microwave Theory and Techniques* (Jan. 2002) 50(1): 316-331.

Darabi, et al., "Highly Integrated and Tunable RF Front Ends for Reconfigurable Mulitband Transceivers: A Tutorial" *IEEE Transactions on Circuits and Systems* (Sep. 9, 2011) 58(9): 2038-2050.

Entesari, et al., "RF MEMS, BST, and GaAs Varactor System-Level Response in Complex Modulation Sytems" *Int'l J. of RF and Microwave Computer-Aided Engineering* (2007): 1-13.

Extend European Search Report dated Jun. 28, 2013, issued in European Patent App. No. 12199058.4, filed Dec. 21, 2012.

Ahn, et al., "A 1.8-GHz 33-dBm P 0.1-dB CMOS T/R Switch Using Stacked FETs With Feed-Forward Capacitors in a Floated Well Structure" *IEEE Transactions on Microwave Theory and Techniques* (Nov. 2009) 57(11): 2661-2670.

\* cited by examiner

TUNABLE IMPEDANCE NETWORK

RELATED APPLICATIONS

This application claims priority under 35 U.S.C. §119(a)-(d) to European Patent Application No. EP 12199058.4, filed Dec. 21, 2012, the disclosure of which is hereby incorporated by reference in its entirety.

BACKGROUND

Field

The present invention relates generally to tunable impedances. In particular, the present invention relates to tunable impedances that can for example be used in wireless communications and more particularly in radio transceivers.

Description of the Related Technology

Many modern wireless standards such as HSPA+ (Evolved High-Speed Packet Access) and LTE (Long Term Evolution) require frequency division duplexing (FDD) operation. FDD is the process of transmitting and receiving with one wireless node at the same time, but at a frequency offset. Isolation between the transmitter and receiver is a critical issue to guarantee a reliable communication channel, since a typical receiver saturates in the presence of the interference generated by the transmitter (commonly referred as a self-interference). Surface acoustic wave (SAW)-based duplexers are typically used in modern cell phones to tackle the issue of self-interference by providing the necessary isolation. SAW components, however, have several issues. First of all, they cannot be integrated with a complementary metal-oxide semiconductor (CMOS) die, leading to a higher bill of material (BOM). Second, they are fixed frequency filters, and with the ever increasing amount of bands, this means more and more SAW duplexers are required.

A promising method has already been proposed to implement a tunable duplexer in CMOS, called electrical balance duplexing. Using this method, several fixed frequency SAW-based duplexers may be replaced by a single tunable duplexer, which decreases the bill of material. The concept of electrical balance duplexing is illustrated in FIG. 1. In electrical balance duplexing, the power amplifier (PA) 110 signal (i.e. at the transmitter (TX) port) is equally split across both the antenna impedance $Z_{ANT}$ 120 and a so-called balance impedance network $Z_{BAL}$ 130. When the impedance of the balance impedance network $Z_{BAL}$ 130 is equal to the antenna impedance $Z_{ANT}$ 120, the TX signal is common-mode to the differential balun 140, and ideally no signal couples to the low-noise amplifier (LNA) 150 side, i.e. no current is induced in the secondary winding of the transformer on the low-noise amplifier (LNA)-side 144 (i.e. the receiver (RX) 150 port). This is called electrical balance. In this way, the low-noise amplifier 150 from the RX is isolated from the TX, so that no self-interference problems occur.

Ideally, both the balun 140 and the balance network $Z_{BAL}$ 130 are integrated together with the transceiver to save on the bill-of-materials. Modern software-defined radio (SDR) implementations are implemented in digital CMOS so that the baseband processor are integrated on the same die as the analog front-ends.

Several implementation problems of the antenna impedance balancing network ($Z_{BAL}$ in FIG. 1) limit practical implementations of electrical balance duplexing. First, the impedance of the balance impedance network $Z_{BAL}$ 130 has to be tunable to cover the required antenna impedance $Z_{ANT}$ 120 across frequency. Tunable components implemented as for example a network of switched passive components (inductors, capacitors and resistors) may provide a tunable passive impedance, which depends on the passives that are switched on.

Second, the tunable components need to be highly linear in order not to degrade achieved transmitter chain linearity performance, even upon high PA power. At high PA power levels, a certain adjacent channel leakage ratio (ACLR) performance is achieved by the transmitter chain, to adhere to the transmission mask as defined by the standard. When a non-linear component is added between the PA 110 and the antenna 120 (e.g. a duplexer with non-linear switches), this ACLR performance should not be degraded. A simple measure of linearity performance of any RF component is the input-referred $3^{rd}$ order intermodulation extrapolation point (IIP3). A typical example shows that the required IIP3 should be as high as +53 dBm at 30 dBm output power while achieving a TX chain performance of −40 dBc ACLR.

Third, the switchable components in the balance impedance network $Z_{BAL}$ 130 have to withstand the high voltage swings of the PA 110 (which may have peak RMS levels as high as about 10 to 20V). In digital CMOS, the main method of switching passive impedance components is with thin-oxide transistors. Thin-oxide MOS transistors have low breakdown voltages (up to about 3V) and the PA signal severely limits lifetime expectancy of such implementations, if it would not cause immediate breakdown. If, as described by Minsik Ahn et al. In "A 1.8 GHz 33-dBm P 0.1-dB CMOS T/R Switch Using Stacked FETs With Feed-Forward Capacitors in a Floated Well Structure", IEEE Transactions on Microwave Theory and Techniques, Vol. 57, No. 11, November 2009, stacked-FETs with feed-forward capacitors in a floating well structure are used as switches, high-voltages could potentially be sustained in CMOS.

However, in this solution, multiple devices are used to be able to withstand higher voltages. For some implementations, sufficient linearity may not be achieved. Unlike generic CMOS switches, these stacked-FET switches may suffer from additional parasitics, possible impacting tuning range performance. Finally, implementation may not be straight-forward, since models of such devices may not be readily available.

SUMMARY OF CERTAIN INVENTIVE ASPECTS

Certain embodiments have an impedance with guaranteed operation when a voltage swing is applied which far exceeds the breakdown voltage of a thin-oxide CMOS transistor, implementable in a CMOS process. The switches in the tunable impedance do not experience breakdown effects. The switches in the tunable impedance do not generate too much non-linearity (e.g. intermodulation products or large-signal compression). The above is accomplished by embodiments according to this disclosure.

In a first aspect, the present invention provides for a tunable impedance network. The tunable impedance network includes a plurality of transformers connected in series. Each transformer has a primary winding and a secondary winding. The transformers have a voltage transformation ratio of N:1 with N>1. The tunable impedance network further includes a plurality of impedance structures. Each of the plurality of impedance structures, is connected at the secondary winding of each of the plurality of transformers. Each of the plurality of impedance structures is configured to act as a resonant circuit together with the inductance of the secondary winding. The impedance structure is a tunable passive network comprising at least one tunable resistor and at least one tunable capacitor. Each tunable resistor and tunable capacitor comprises at least one transistor.

For some implementations, the tunable impedance network further includes a control circuit. The control circuit is configured to tune the imaginary part of at least one of the impedance structures so as to change its resonance frequency to mimic a reference impedance. The control circuit is also configured to tune the real part of at least one of the impedance structures so as to change its Q-factor to mimic the reference impedance.

It is an advantage of a tunable impedance network according to embodiments of the present invention that, due to the presence of a plurality of transformers connected in series in the tunable impedance network, each impedance structure, and hence the components of the impedance structure, experiences a lower voltage than the voltage at the primary windings of the transformers, and hence the totality of the tunable impedance network can withstand higher voltages than prior art tunable impedance networks can. Furthermore, getting the voltages over the components of the impedance structures down increases the linearity of the tunable impedance network.

It is a further advantage of a tunable impedance network according to embodiments of the present invention that all its components can be implemented in standard CMOS. Using standard CMOS does not require any complex manufacturing.

The impedance of a tunable impedance network can be tuned so that a reference impedance can be mimicked or matched. In a tunable impedance network according to embodiments of the present invention, the impedance of the impedance structure may have a real and an imaginary part.

In embodiments of the present invention, the impedance structure may be a tunable passive network. The tunability of the tunable passive network may for example be obtained by tunable passive components. In embodiments of the present invention, the tunable passive network may comprise a bank of parallel switched resistors and capacitors. Such parallel switched resistor and capacitor network is easy to use for tuning. Alternatively, the passive network may comprise a tunable resistor and a tunable capacitor, which may be realized with transistors configured to act as a variable resistor and capacitor. A tunable impedance network allows separation of control or resonance frequency from control of Q-factor of the impedance.

In a tunable impedance network according to embodiments of the present invention, the tunable passive network may include at least one series or parallel connected, tunable or not tunable, passive or active inductor. In a tunable impedance network according to alternative embodiments of the present invention the impedance structure may include at least one active component, such as for example, but not limited thereto, a negative resistor e.g. for correcting for losses.

In a tunable impedance network according to embodiments of the present invention, one side of the impedance structure may be grounded. In a tunable impedance network according to embodiments of the present invention, the transformation ratio may be the same for the plurality of transformers. This allows to determine the required values for components of the impedance structures in an easy way.

The impedance structures may be equal for all transformers. This allows to determine the required values for components of the impedance structures in an easy way.

The impedance structures may be different for one or more transformers. This allows mimicking of the antenna at multiple frequencies. For example, in electrical balance duplexing in FDD systems, the antenna has to be mimicked independently at both TX and RX frequencies due to the impedance difference which may be present between those frequencies, in order to prevent both the direct TX signal and the TX noise at RX frequency from leaking into the RX and desensitizing the RX.

A tunable impedance network according to embodiments of the present invention may be implemented in CMOS technology, hence not requiring complex manufacturing technology.

In a second aspect, the present invention provides for a method of tuning the impedance of a tunable impedance network to a reference impedance having a real and imaginary part. The tunable impedance network comprises a plurality of transformers connected in series, each transformer having a primary winding and a secondary winding. The transformers have a voltage transformation ratio of N:1 with N>1, with an impedance structure connected at the secondary winding of each transformer. Each impedance structure acts as a resonant circuit together with the inductance of the secondary winding. The impedance structure comprises a tunable passive network comprising at least one tunable resistor and at least one tunable capacitor. Each of the tunable resistor and the tunable capacitor comprise at least one transistor. The method includes tuning the imaginary part of at least one of the impedance structures so as to change its resonance frequency to mimic the reference impedance. The method further includes tuning the real part of at least one of the impedance structures so as to change its Q-factor to mimic the reference impedance.

It is advantageous that, in accordance with embodiments of the present invention, by changing the real part of at least one of the impedance structures the Q-factor and the peak height of the resonance of the tunable impedance network change, but not the resonance frequency. Hence, in accordance with embodiments of the present invention, tuning of the resonance frequency is decoupled from tuning of the Q-factor.

In a method according to embodiments of the present invention, tuning of the imaginary part and/or of the real part may include separately tuning different impedance structures.

A method according to embodiments of the present invention may further comprise retuning the impedance structures, e.g. capacitor and/or resistor values, during operation. This way, online tuning may be obtained.

Another aspect provides for an electrical balance duplexer comprising a tunable impedance network as summarized above and described herein, configured to balance impedance with an antenna.

Another aspect provides for a circuit comprising an antenna, a power amplifier, and a tunable impedance network as summarized above and described herein, configured for antenna matching.

Another aspect provides for a tunable band-pass filter comprising a tunable impedance network as summarized above and described herein, configured to band-pass filter over the outer terminals of the series of connected first windings. When no real part e.g. resistor, is present, then the resonant LC tank acts as a bandpass filter, allowing only transfer of signals within the bandwidth of the resonance peak. Tunable bandpass filters that can withstand high voltages and are very linear are desirable components.

Tunable impedances in accordance with embodiments of the present invention can for example be used in an electrical balance-based duplexing solution for FDD which achieves sufficient linearity performance in both transmitter-to-antenna and antenna-to-receiver paths; or antenna matching circuits for use with radio transceivers; or as a tunable band-pass filter.

Another aspect provides for an integrated circuit comprising a tunable impedance network as summarized above and described herein. The integrated circuit also includes a processor configured to tune the tunable impedance network as summarized above and described herein. The present invention provides an integrated circuit comprising a tunable impedance according to any of the embodiments of the first aspect. The integrated circuit may further comprise a control circuit or a processor arranged for tuning the impedance network according to any of the embodiments of the second aspect.

Using, in accordance with embodiments of the present invention, a tunable impedance network comprising multiple series connected transformers with a voltage division ratio of higher than 1:1 in a tunable impedance network in a wireless communication system, the high-voltage swing of the PA is split across the transformers and is divided down through the transformers. This provides at least four advantages. First, impedance tuning is possible, since at the low-voltage (secondary) side of the transformers, a switched passive network sets the total network impedance. Second, the tunable components that allow tuning of the impedance are safe from breakdown, due to the splitting and down-transformation of high-voltage signals across the components in the network. Third, the tunable network achieves a high linearity that naturally arises from the splitting and down-transformation of high-voltage signals across the network into low-swing and therefore high-linear signals. Fourth, the impedance network in accordance with embodiments of the present invention may be implemented in plain digital CMOS without additional process steps.

It is an advantage of a tunable network according to embodiments of the present invention that it allows to use only standard components available in any plain digital CMOS process.

Another aspect provides for a tunable impedance network. The tunable impedance network includes means for transforming an input series of voltages to an output series of voltages by a voltage transformation ratio of N:1 with N>1. The tunable impedance network further includes means for tuning an impedance of each of a series of impedance structures of the transforming means. The means for tuning an impedance includes means for tuning the imaginary part of at least one of the impedance structures so as to change its resonance frequency to mimic a reference impedance. The means for tuning an impedance further includes means for tuning the real part of at least one of the impedance structures so as to change its Q-factor to mimic the reference impedance. In some implementations, the means for transforming an input series of voltages comprises a plurality of transformers. In some implementations, the means for tuning an impedance of each of a series of impedance structures means comprises a series of tunable passive networks. In some implementations, the means for tuning the imaginary part of at least one of the impedance structures comprises a control circuit. In some implementations, the means for tuning the real part of at least one of the impedance structures comprises the control circuit.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
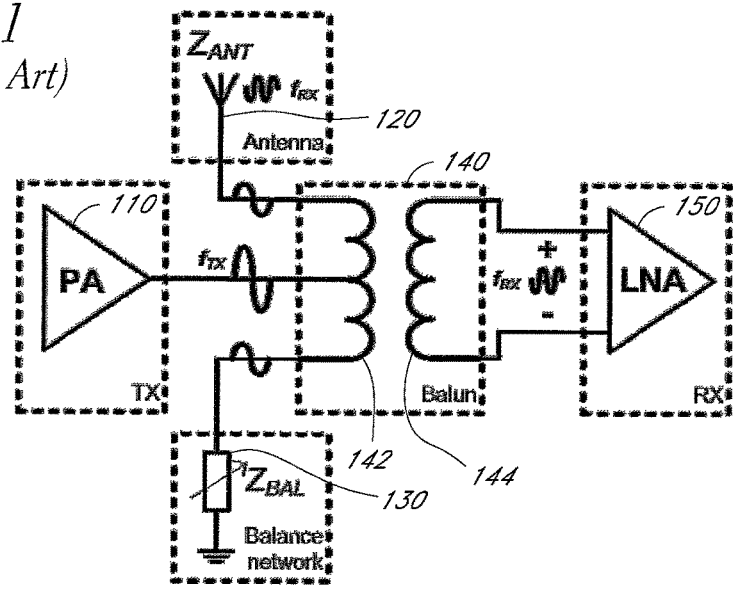
FIG. 1 schematically illustrates prior art electrical balance duplexing.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope. In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in the context of the present invention, the term "impedance matching" is used, this refers to the process of making one impedance look like another. This may for example be applied in electrical balance duplexing, where the impedance of a balance impedance network is made to look like, or match, an antenna impedance.

Hereto, a "tunable impedance matching network" may be used, which in the context of the present invention refers to a network of electronic components, mostly passive electronic components, e.g. resistors, capacitors and inductors, of which the impedance can be changed (tuned).

In the context of the present invention, a transformer is an electrical device that converts between two impedances.

Also in the context of the present invention, a balun is a specific way of connecting other electrical components (e.g. antenna, receiver, amplifier, etc.) to a transformer, namely in a unbalanced (also called single-ended) manner and balanced (also called differential) manner to use the impedance transformation operation of the transformer to transform an unbalanced impedance to a balanced impedance.

Embodiments of the present invention provide a tunable impedance network 200, comprising a plurality of transformers 204, 208 connected in series. Each transformer has a primary side with a primary winding and a secondary side with a secondary winding. The transformers have a voltage transformation ratio of N:1, where N>1. The primary side 210 of these transformers (the side of N) is adapted for being operatively coupled, all in series, in the circuit 220 where the impedance is to be provided. At the secondary side 212 of each transformer, an impedance structure 220 is provided, the impedance of which has real and an imaginary part, and which, together with the inductance of the secondary winding 222 acts as a resonant circuit. The impedance structure 220 may be a passive network. In particular embodiments, the passive network comprises at least one tunable resistor 250 and at least one tunable capacitor 240, wherein each of the tunable components comprises at least one transistor configured to act as variable resistor 250 or as a variable capacitor 240, respectively. A transistor operating in the linear region may be configured as a variable resistor when the drain-source DC voltage is set to zero. A variable resistor 250 is thus formed between the drain and source nodes, which is may be changed by controlling the DC gate-source voltage. This effectively results in controlling the channel resistance of the transistor. Likewise, a transistor operating in the linear region may be configured as a variable capacitor 240 when its source and drain nodes are shorted together. In this case, a variable capacitor 240 is formed between the gate and drain-source nodes of the transistor, which may be adjusted by controlling the DC gate to drain-source voltage across the transistor.

In some embodiments, the at least one tunable resistor 250 and the at least one tunable capacitor 240 may be implemented as a bank of parallel switched resistors and a bank of switched capacitors respectively, wherein each bank comprises a plurality of transistors acting as switches. By controlling which transistors are enabled (conducting) the total resistance of the resistive bank and the effective total capacitance of the capacitor bank can be changed, respectively. In other derivative embodiments, inductors (tunable or otherwise) may be included in series or parallel with the before mentioned tunable resistor and capacitor to further change the frequency of resonance of the impedance on the secondary side 222 of the transformer. Tunable inductors, however, are difficult to make in a passive manner in CMOS implementations, and are hence not preferred in the passive network. The impedance structure may further include at least one active component, for example, but not limited thereto, a negative resistor e.g. for correcting for losses.

For simplicity the invention will be described in more details below with reference to the example implementation of the tunable impedance structure as a bank of switched parallel resistor and a bank of switched parallel capacitors.

Figure 2:
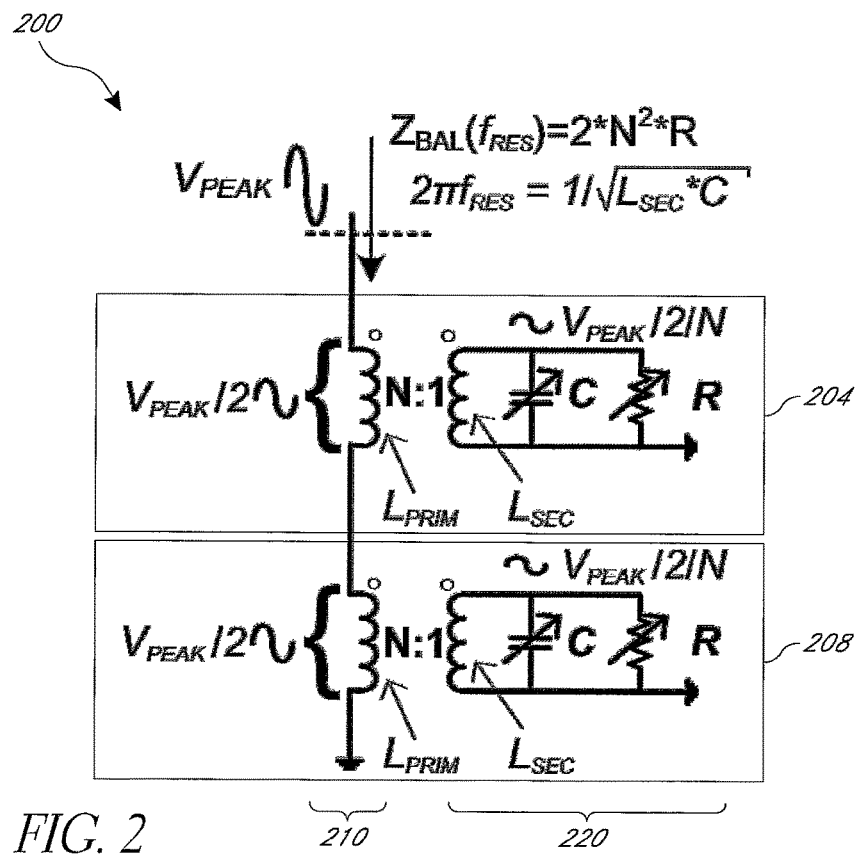
FIG. 2 schematically illustrates a tunable balance network impedance circuit architecture according to embodiments of the present invention, FIG. 3 schematically illustrates impedance versus frequency (real and imaginary parts) for a tunable impedance network in accordance with embodiments of the present invention, FIGS. 4A and 4B schematically illustrate a method according to embodiments of the present invention for tuning the different components in a tunable impedance network in accordance with embodiments of the present invention in an iterative manner to improve, e.g. optimize, the value of the impedance of the tunable impedance network to be equal to a reference impedance network, and FIG. 5 schematically illustrates tuning a tunable impedance network according to embodiments of the present invention.

FIG. 2 illustrates a tunable impedance network 200, as an example only, with two transformers 204, 208 connected in series. In the more general case, X transformers can be coupled in series, X being at least two. In the embodiment illustrated, the transformers have a voltage transformation ratio of N:1 with N>1. In the embodiment illustrated, all transformers have a same voltage transformation ratio N:1. In general, however, the different voltage transformation ratios do not need to be equal; hence the X transformers each have a transformation ratio $N_i$:1, with $N_i$>1, i=1 . . . X. In accordance with embodiments of the present invention, at the secondary side 222 of each transformer, i.e. at the secondary winding 222 thereof, an impedance structure 220 is provided which acts as a resonant circuit together with the inductance of the secondary winding 222. In the embodiment illustrated, at the secondary side 222 of each transformer, i.e. at the secondary winding thereof 222, an equal impedance structure is connected. For example, the tunable resistor 250 and the tunable capacitor 240 components (e.g. the banks of parallel switched resistors and capacitors) at the secondary side 222 of each transformer may have an equal total resistance and an equal total capacitance, respectively. In some embodiments, however, the tunable resistor 250 and capacitor 240 components at the secondary windings 222 of the transformers may be different, and hence one or more of the transformers, or each of them, has a different resonant circuit. This may be required in electrical balance duplexing, for example, in FDD systems when the antenna has to be mimicked at both TX and RX frequencies due to the impedance difference between those frequencies. In particular embodiments, the impedance structures, e.g. the banks of parallel switched resistors and capacitors, may be grounded at one side. Grounding or not grounding the tunable components in principle does not change the operation. However, typically, grounded switches show more reliable performance with respect to linearity and switch breakdown.

The transformers each transform a portion of the high input voltage at the primary side 210 of the tunable impedance network, illustrated $V_{PEAK}$ in the example, into smaller voltages. In case the X transformers all have the same transformation ratio, the high input voltage experienced by each of the transformers is divided by X. In the example illustrated, where two transformers 204 208, both with equal transformation ratio N:1, are provided, the primary sides of the transformers experience a voltage swing of $V_{PEAK}/2$.

The secondary sides of the transformers experience a voltage swing which depends on the voltage at the primary side, and on the transformation ratio of that particular transformer. In the embodiment illustrated, with two transformers with equal transformation ratio, the voltage at the secondary side of the transformer equals $V_{PEAK}/2/N$. This voltage is applied to tunable components, e.g. the banks of parallel switched resistors and capacitors. As this voltage is lower than the original voltage $V_{PEAK}$ experienced by the tunable impedance network, the tunable components of the impedance structure, e.g. banks of parallel switched resistors and capacitors that allow tuning of the impedance are safe from breakdown. It is hence an advantage of a tunable impedance network of embodiments of the present invention that it can withstand higher voltages compared with prior art tunable impedance networks.

At the secondary side, the impedance structure 220, e.g. a switched passive network, sets the total network impedance, hence allows impedance tuning.

In the embodiment illustrated, the transformers' secondary side 222 is resonated with an impedance structure 220, e.g. a tunable capacitor bank, so that $$f_{RES} = 1/(2*\pi*\text{sqrt}(L_{sec}*C)).$$

with $f_{RES}$ the resonance frequency of the impedance structure, $L_{sec}$ the inductance of the secondary winding 222 of the transformer, and C the capacitance of the impedance structure 220 on the secondary side 222 of the transformer. In general, when additional inductors (coupled in series or in parallel and tunable or not tunable) are included, the resonance frequency $f_{RES}$ of the impedance structure becomes also dependent on these additional inductors.

The total real part of the impedance structure offered (at resonance frequency) looking into the top node in FIG. 2 is $2*N^2*R$, where R is the total real impedance value of the tunable banks.

In case of equal transformation ratios and equal banks of parallel switched resistors and capacitor, the voltage across the total network is divided by X (the number of transformers), e.g. 2 in the example illustrated, because of the equal impedance offered by each separate transformer 204 208. The final voltage across the tunable components is divided even further with transformation ratio N, so that a large, e.g. 10-20$V_{peak}$ PA signal may be sustained. For example, in FIG. 2 with two transformers 204 208, each with a turn ratio of 3 (N=3), the voltage of 20$V_{peak}$ is divided down to below 4V, which can be readily handled by e.g. tunable resistor 250 and capacitor 240 banks using CMOS transistors as switches or when using CMOS transistors configured to act as tunable resistor or capacitor components. Also, as a consequence, at the same time linearity is increased by $20*\log_{10}(2*N)$ since the root cause of the non-linearity, as e.g. the switches in the bank of switched components on the secondary side of the transformer, experience the lowered voltage swing on the secondary side of the transformers, thereby effectively shifting the same non-linearity performance to a higher input voltage level.

In modern process technology, e.g. CMOS technology, transistors have limited breakdown voltages and/or lifetime constraints regarding the voltage stress the devices may experience during operation. In typical cellular applications (e.g. FDD), voltage swings can well exceed the safety limits for required device lifetime or even for device breakdown. Thus, it is essential to reduce the high-voltage swings corresponding to the high-power signals to avoid damaging the CMOS transistors inside the tunable impedance network.

It is to be noted that the network illustrated in FIG. 2 is one example only of a general structure, where any amount X of transformers can be implemented with any value for the transformation ratio N.

Figure 3:
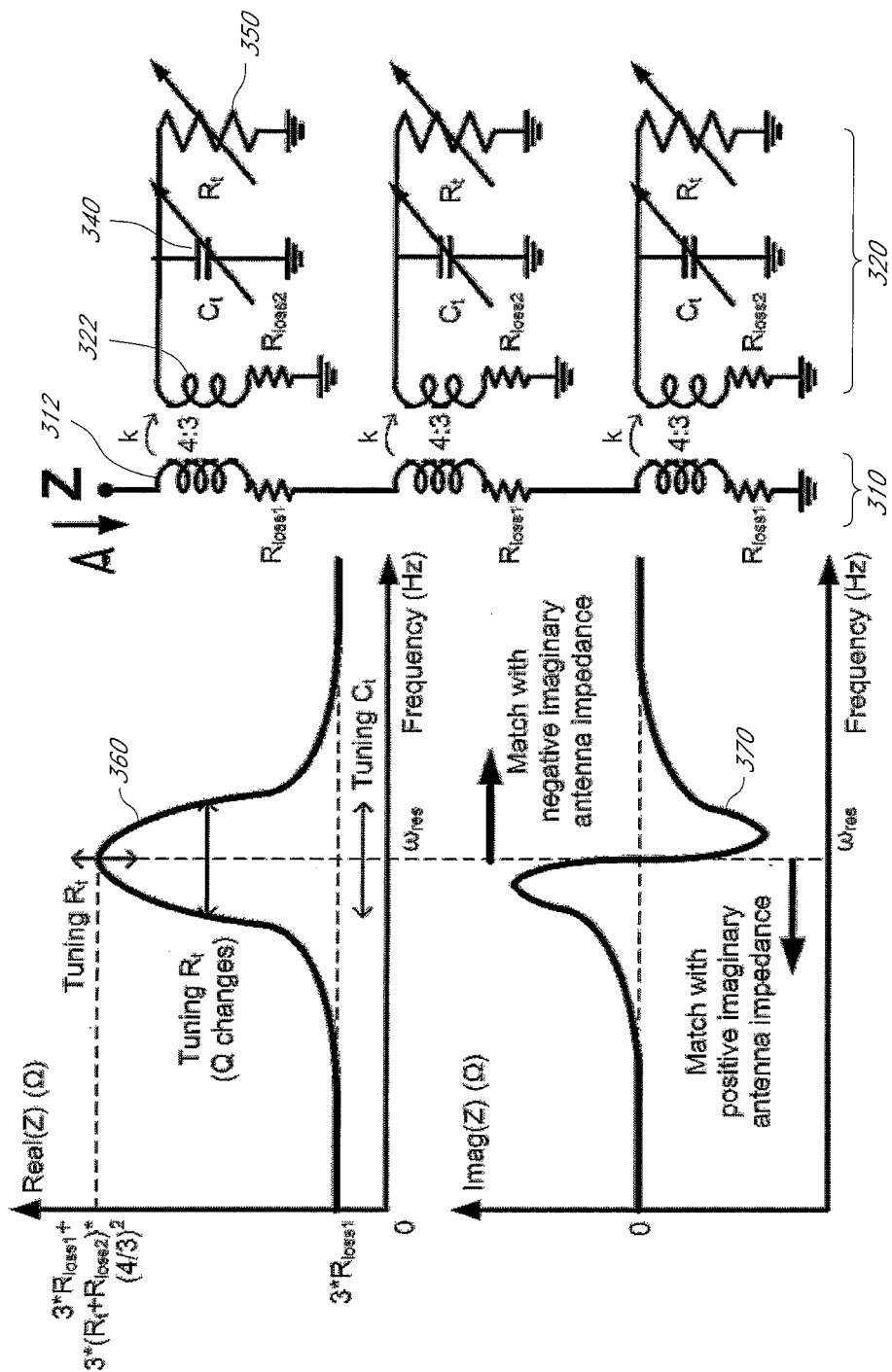

In particular embodiments of the present invention, the tunable impedance network according to embodiments of the present invention may provide a balance impedance for an electrical balance duplexer. In contrast to typical implementations, which use some combinations of passive components to adapt the impedance across frequency, this network creates an impedance in a resonating manner. That is, the secondary side of each transformer shown in FIG. 3 resonates at frequency $\omega_{res}$. The impedance profile (real 360 and imaginary part 370) of a resonance is shown in the left hand part of FIG. 3. When different tunable resistors 350 and capacitors 340 are added after the different transformers, their respective resonance profiles add up in series when considered from the top node. In this way, an impedance profile can be constructed across frequency, using the various resonance frequencies and Q-factors of the resonators to obtain both the desired real and imaginary part across frequency.

It is an advantage of a tunable impedance network according to embodiments of the present invention that it can be implemented in standard CMOS technology. In embodiments of the present invention, all parts of the tunable impedance network, e.g. the transformers and the impedance structures such as passive networks, can be implemented on a single die. In alternative embodiments, different parts could be implemented on different dies. The transformers could for example be implemented on an interposer die, where an implementation could benefit from better inductive elements with a higher quality factor.

By tuning the capacitor value, the resonance frequency of the tunable impedance may be set, while the resistor changes the value corresponding to the top of the real part of the impedance and the width of the impedance peak (e.g. the Q factor of the resonant network). In the example embodiment illustrated in FIG. 3, the total impedance of the tunable impedance network consists of the summed impedances from three of such resonating impedance structures.

Embodiments of the present invention include a method of mimicking, with a tunable impedance network as described above, a reference impedance, such as for example an antenna impedance. The method described herein operates in an iterative fashion to obtain a good match between the reference impedance and the tunable impedance. With a good match is meant that, at a certain wanted frequency, the real and imaginary parts of the tunable impedance are both equivalent to respectively the real and imaginary parts of a reference impedance, for example within an accuracy of 0.1%.

The here above mentioned accuracy of 0.1% is to be noted as an example: with an accuracy of 0.1% in mimicking an antenna impedance while operating under the regime of the Long Term Evolution (LTE) standard it can be shown that in an electrical balance duplexer, one may achieve about 50 dB of isolation between the TX and RX, which sufficiently suppresses the self-interference at the wanted frequency. From hitherto and going forward, given accuracy numbers relating to the claims are to be considered as example numbers; any different requirement would only imply a redesign of the tunable network.

Figure 4A:
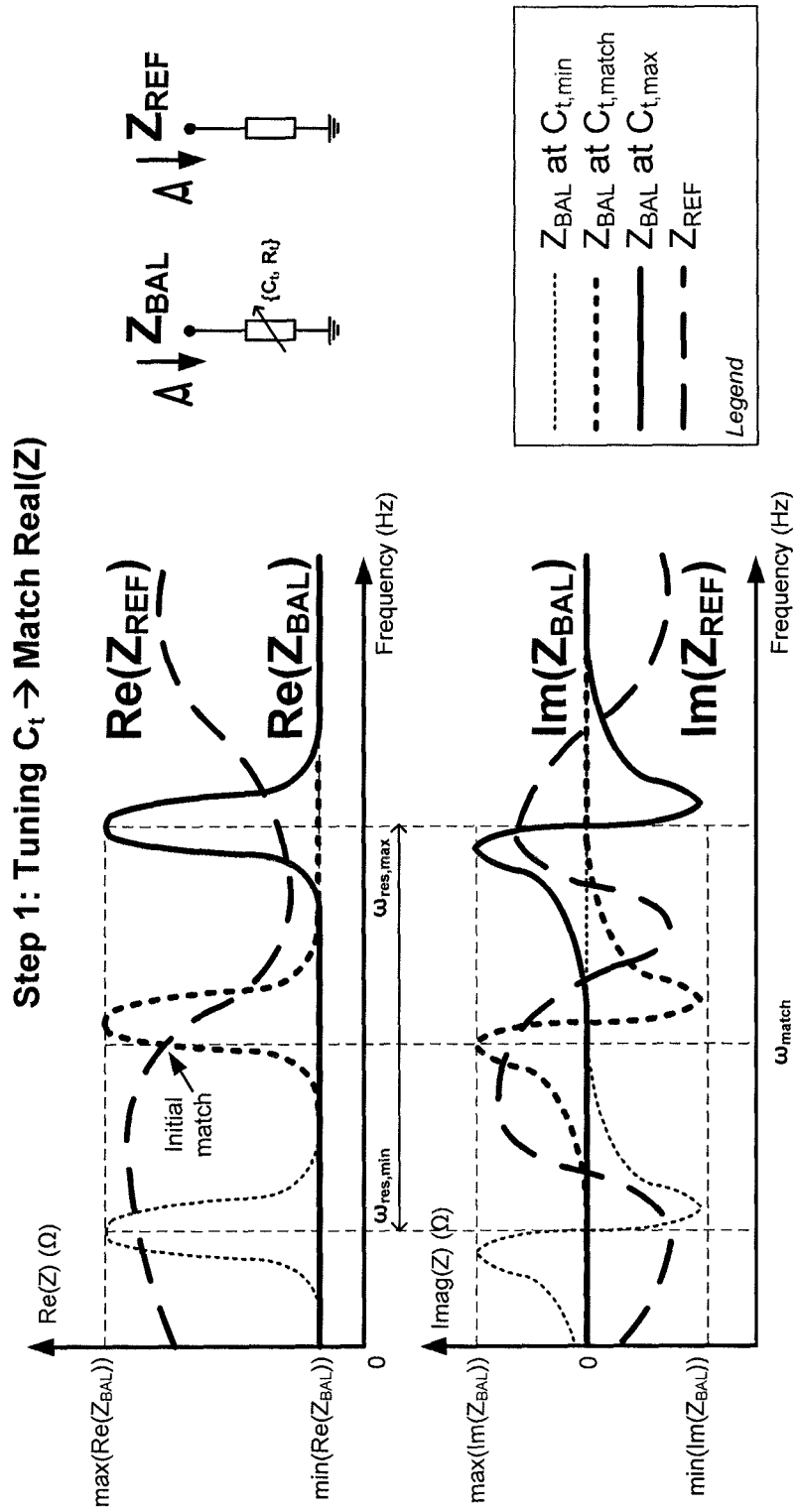

The method includes in a first step tuning the imaginary part of at least one of the impedance structures so as to change its resonance frequency to mimic the reference impedance. In particular embodiments (where the impedance structures for each transformer are the same), the imaginary part may be tuned as illustrated in FIG. 4A. In this case, tuning the imaginary part of an impedance structure may include tuning of the capacitor value of the tunable impedance network so that the peak at resonance frequency $\omega_{res}$ of the real part of the impedance of the tunable impedance network sweeps through the whole frequency range to find an initial match with the reference impedance at the frequency of interest. With initial match is meant that, at a certain wanted frequency, the impedance value of the impedance network and of the reference impedance are equal within a predetermine accuracy, e.g. an accuracy of at least (LTE example) 2% at a given setting. With an accuracy of 2%, in the application example of electrical balance duplexing, at least 30 dB of isolation between the TX and RX is guaranteed at the wanted frequency.

Figure 4B:
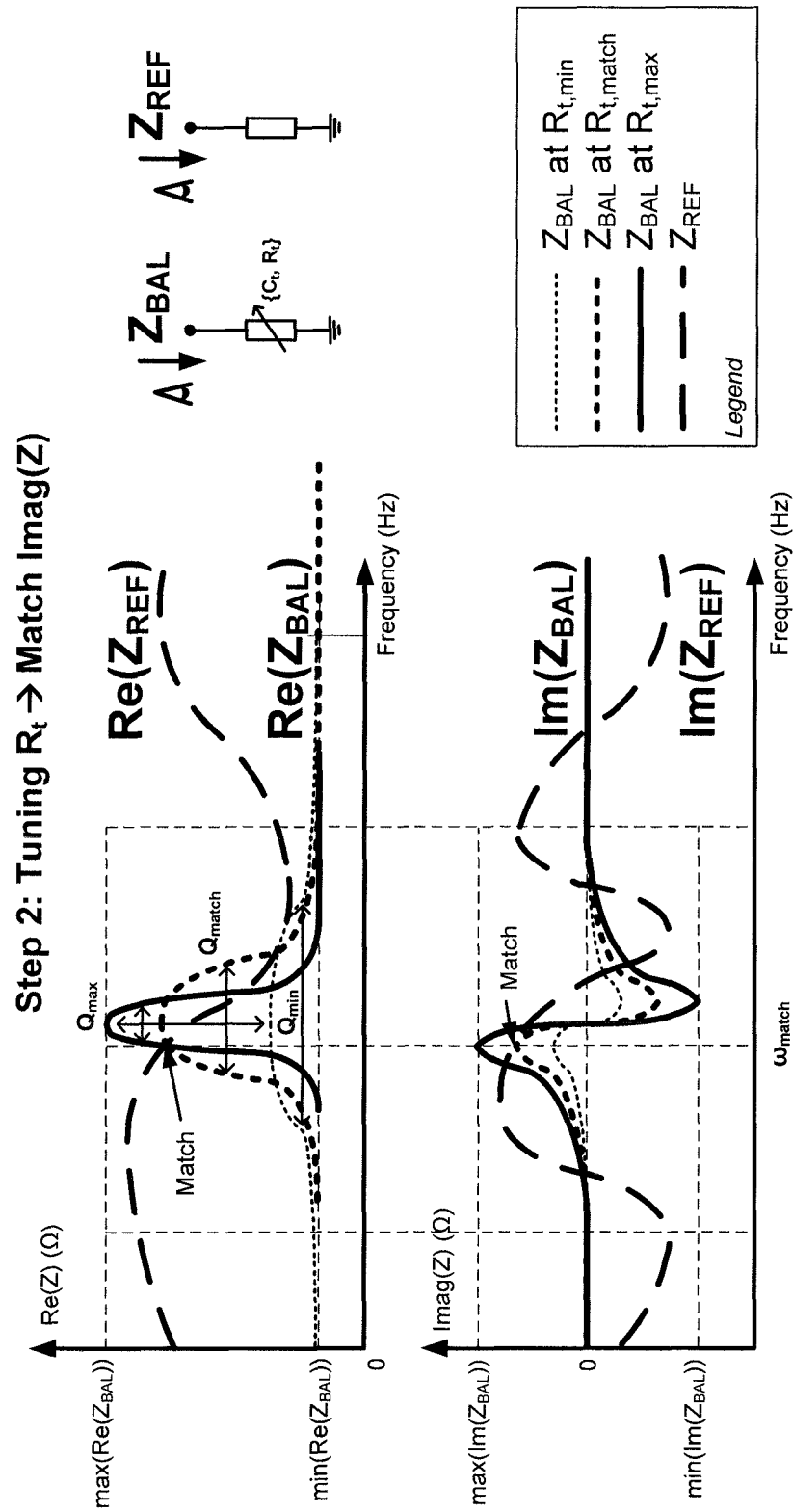

The method of tuning according to embodiments of the present invention includes, in a second step, tuning the real part of at least one of the impedance structures so as to change its Q-factor to mimic the reference impedance. In particular embodiments (where the impedance structures for each transformer are the same), as for example illustrated in FIG. 4B, tuning the real part of an impedance structure may include changing the resistor value to tune the Q-factor of the tunable impedance network so that the reference impedance and the tunable impedance network's impedance match within an accuracy more than achieved in the first step, e.g. <2% at a given setting. In the present embodiment, due to the fact that the tunable impedance network has a resonant profile, both a positive imaginary impedance and a negative imaginary impedance may be created to mimic to a reference impedance which might have (a) a positive (inductive impedance) imaginary impedance at the frequency of interest, (b) a negative (capacitive impedance) imaginary impedance at the frequency of interest, or (c) a resonant impedance profile at the frequency of interest.

In the present embodiment of the tunable impedance network, tuning the resistor values of the tunable impedance structure at the same time tunes the Q factor of the impedance of the impedance structure.

It is an advantage of embodiments of the present invention that the tunable impedance network allows a separate control of the resonance frequency of the impedance and of the Q-factor of the impedance.

The method of tuning according to embodiments of the present invention may include, after the second step, an iteration of steps 1 and 2 to stepwise improve upon the accuracy obtained, until a good match is obtained, a good match again being defined as, at a certain wanted frequency, that the real and imaginary parts of the tunable impedance are both substantially equivalent, e.g. equivalent to respectively the real and imaginary parts of a reference impedance, within an accuracy of (LTE example) 0.1%.

The proposed tuning method according to embodiments of the present invention may be used for instance for antenna balancing. At some frequencies, an antenna may have a positive imaginary part, while at other frequencies the antenna may have a negative imaginary part. In a tunable impedance network according to embodiments of the present invention, both positive and negative imaginary impedances are available on left or right-side of the resonance frequency. When either is required for matching, the resonance frequency may be shifted by the capacitor to the desired frequency so that imaginary matching is obtained, while the real part can still be balanced separately by changing the resistor.

The present invention allows to mimic, by the tunable impedance network, a reference impedance, e.g. an antenna impedance, during operation. For example, when using the tunable impedance network e.g. in a telecommunications system, the tunable impedance network may be re-tuned during operation to as to accommodate to impedance variations of the reference impedance, e.g. antenna impedance. In particular a tuning may be performed so that an online shift in the resonance frequency of the antenna is dealt with by tuning the capacitor and resistor values online.

Figure 5:
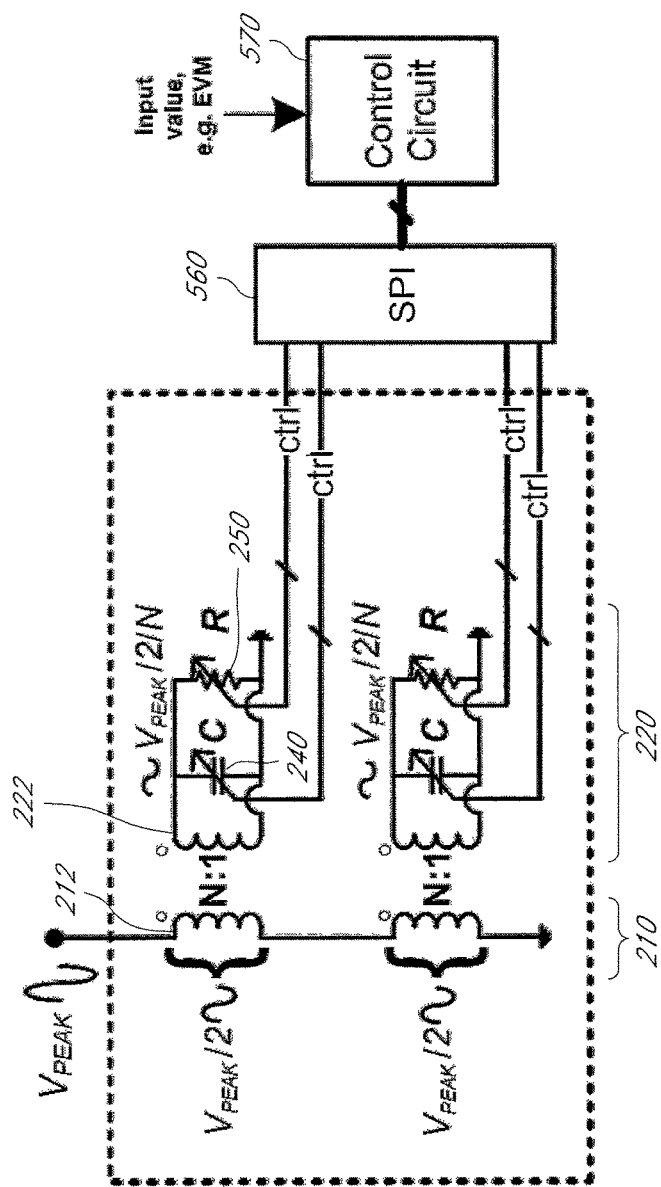
Figure 6:
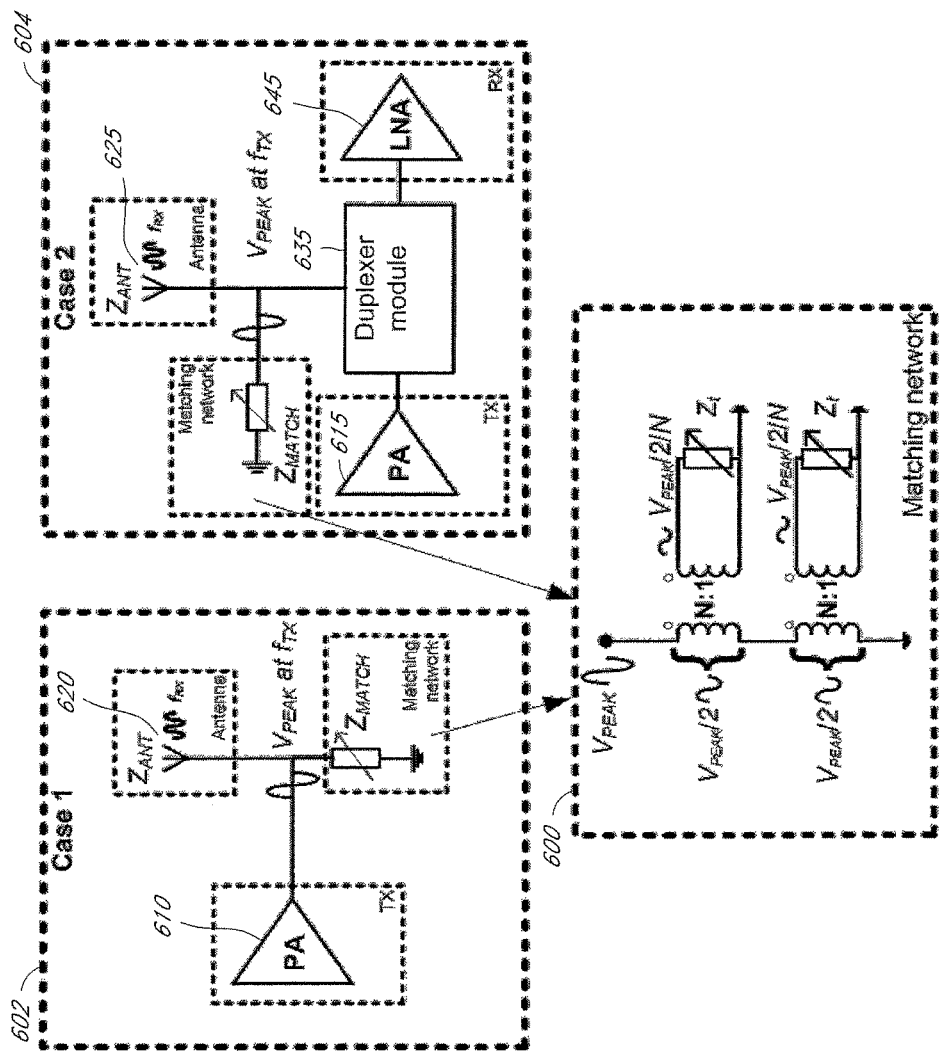
FIG. 6 schematically illustrates using a tunable impedance network according to embodiments of the present invention as a matching network for antennas in telecommunications systems concurrently used with a duplexer or not.
Figure 7:
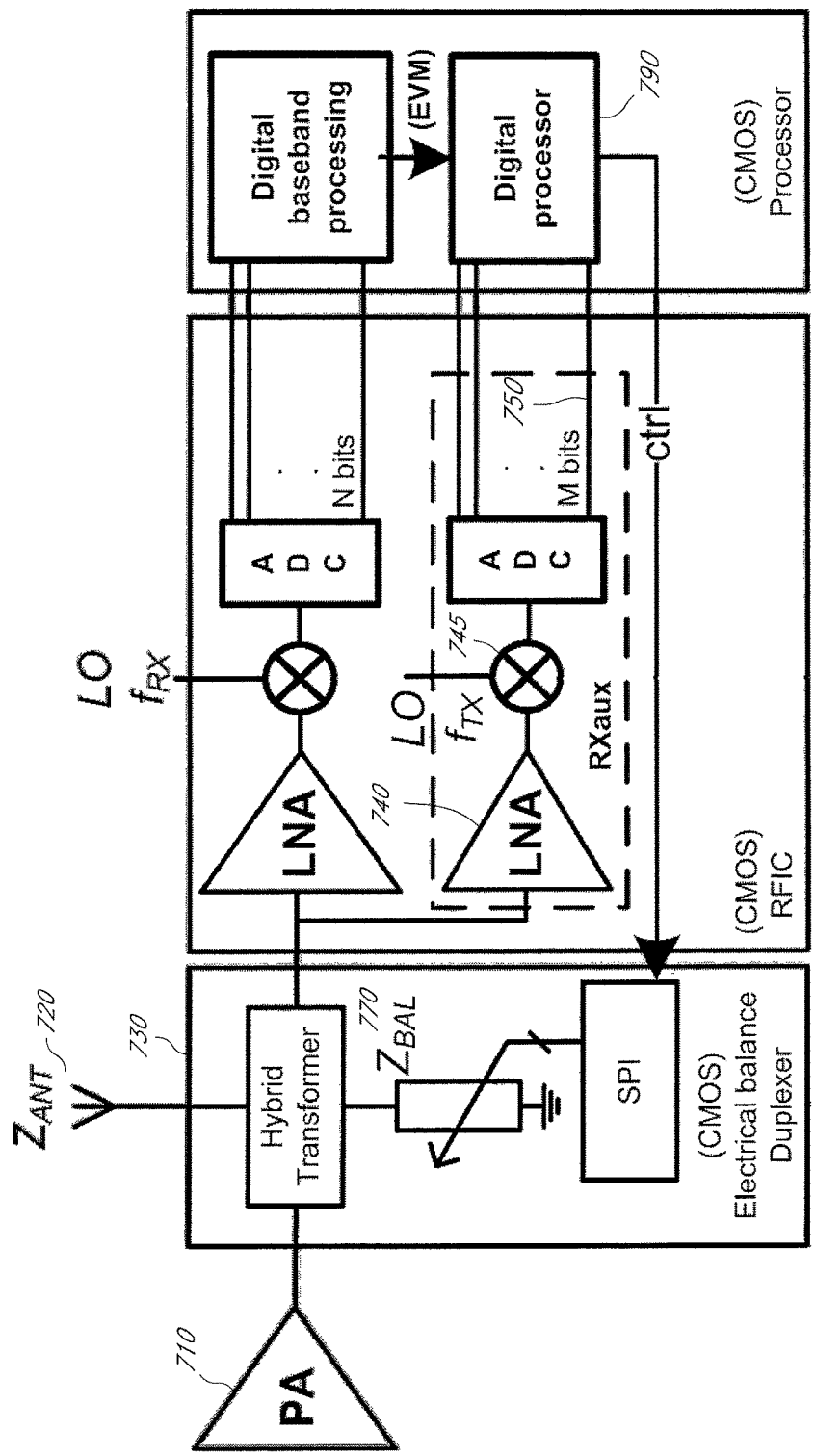
FIG. 7 illustrates a block diagram using a tunable impedance network according to embodiments of the present invention as a balancing impedance network for balancing the impedance of antennas in electrical balance duplexers.
Figure 8:
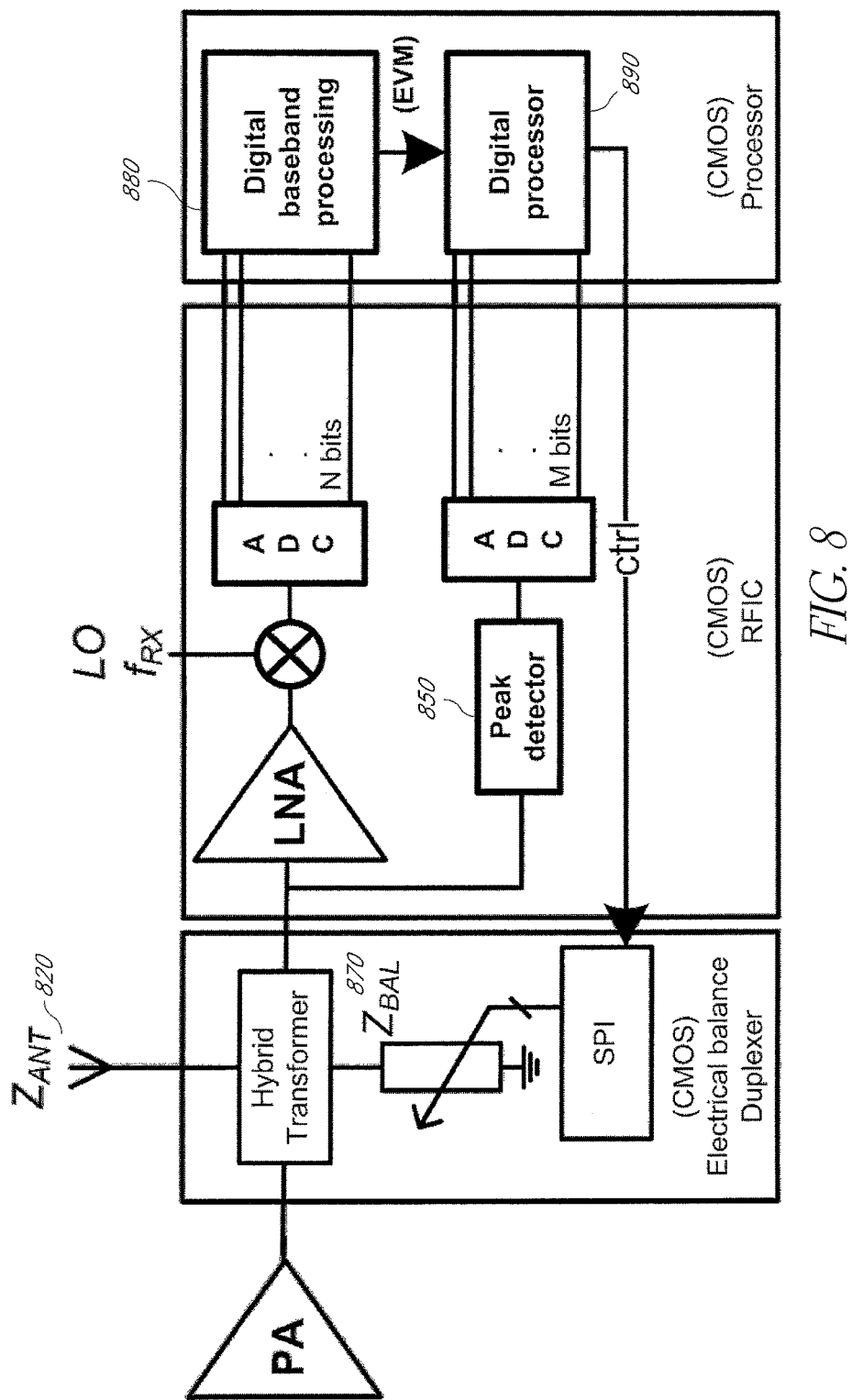
FIG. 8 illustrates an alternative block diagram using a tunable impedance network according to embodiments of the present invention as a balancing impedance network for balancing the impedance of antennas in electrical balance duplexers.

According to some embodiments, the tuning of the proposed impedance network may be done by using a control circuit 570 which tunes the tunable components of the impedance structures $Z_{BAL}$, $Z_{MATCH}$. The control circuit 570 evaluates a value indicative of, e.g. the impedance match between the antenna 610, 615 and the PA 620, 625 (when used as depicted in FIG. 6) or the balance condition of the duplexer 770 870 (when used as depicted in FIG. 7 or FIG. 8) and then outputs a digital control signal ctrl (e.g. a binary word 10010) to control the respective tunable components of the network, as shown in FIG. 5. The control circuit 570/770/870, thus, adjusts the impedance network accordingly to maintain an impedance match or an electrical balance condition within sufficient accuracy. The tuning may be done off-line (when the functional circuit is not operational) or on-line when the functional circuit is operational. In the latter case, the tuning of the operation of the circuit may be done at a practical time interval, for example every 2 msec. Tuning of the tunable components in the impedance structure, effectively changes the real and the imaginary impedance of the tunable impedance network. Preferably, the control circuit is integrated on the same chip; however, off-chip implementation is also possible. In some embodiments, tuning may be achieved by switching on or off resistors and/or by switching on or off capacitors in either or both resistive and capacitive banks. The switches are, thus, controlled by the control circuit 570/770/870. In other embodiments, tuning may be achieved by changing a voltage applied to either or both tunable resistor 250 and capacitor 240 components, in which case a digital-to-analog converter (DAC) is required within the control circuit 570/770/870. A serial-to-parallel interface SPI 560 may be implemented to allow a digital single (bit-stream) to control, e.g. which switches in the banks of resistors and capacitors to be switched on (enabled) and which not. In other embodiments, a digital processor may be used instead of a control circuit. In this case, the digital processor may run an automated algorithm to control the impedance structure.

FIG. 6 schematically illustrates using a tunable impedance network 600 according to embodiments of the present invention as a matching network for antennas in telecommunications systems. Two use-cases are shown. A first example, denoted Case 1 602, illustrates an antenna impedance matching to increase efficiency for power transfer from the PA 610 to the antenna 620 when no duplexer is used, e.g. in time-division duplexing (TDD) cellular applications, where a switch (not shown) connects a PA 610 to the antenna 620 in the transmit-time-slot. In this case, the proposed tunable impedance network 600 is tuned to match the antenna impedance—the real and imaginary impedance of the antenna is adapted to the optimum impedance required by the PA 610, (e.g. 50 Ohms real, 0 Ohm imaginary). Matching can be achieved by monitoring, for example, the power efficiency of the amplifier PA 610. Conventional methods for measuring the power efficiency of an amplifier may be used, for example, the DC current at the output of the amplifier, which is an indication of its power efficiency. An automated algorithm can then set the tuning network such that optimum power efficiency is achieved for the PA. Another conventional method for measuring the quality of the impedance matching between PA and antenna can also be used, for example measuring the power reflected back from the antenna 620 (using for example a coupler and a power meter) and minimizing for that measured power level. Any known conventional method for measuring the reflect power may be used. The second example, denoted Case 2 604, for limiting antenna mismatch conditions in an FDD scheme, where a duplexer 635 is connected between the antenna 625, the TX 615 and the RX 645. A switch (not shown) may still be present, as in case 1, to connect the antenna to the rest of the circuit (e.g. duplexer 635, TX 615 and RX 645). In case 2 604, the tunable impedance network 600 is again tuned to match the antenna 625 impedance using the matching methods mentioned above for Case 1 602.

The use of the proposed tunable impedance network as a balancing impedance network for balancing the impedance of antennas 720 in electrical balance duplexers 730 is described in more details below with reference to FIG. 7. In this use-case, the tunable impedance network $Z_{BAL}$ 770 is tuned to mimic the antenna impedance. To sufficiently suppress (or provide isolation for) the high-power TX signal, and prevent it from leaking into the RX, the impedance network 770 should be tuned at least at both TX and RX frequencies, because the TX signal and also the out-of-band TX noise falling into the RX frequencies limit the RX sensitivity. For tuning of the real and imaginary impedance of the impedance $Z_{BAL}$ 770 at two frequency points—one RX and one TX frequency, four parameters are required for the tuning of the impedance network, for example the four parameters mentioned above. Tuning at any intermediate frequency points or tuning at out-of-band frequency points is also possible if the impedance network is tuned with respect to other parameters, if for example additional resonators are implemented.

In order to determine how much TX leakage is still left at TX frequencies, an ADC-digitized output (Mbits) 750 of an auxiliary receive chain RXaux, connected in parallel with the main receive chain, may be used. TX-leakage signal is first amplified by an LNA 740 and then down-converted by using a mixer 745 operating at the TX frequency $f_{TX}$ to sense the amount of leakage at the TX frequency. When the output of this RXaux is minimum, the TX signal at TX frequency is sufficiently suppressed, which indicates the balance network $Z_{BAL}$ 770 effectively provides the impedance equal to that of the antenna 720 at the TX frequency, and thus also indicating the electrical balance duplexer 730 provides sufficient TX-to-RX isolation at the TX frequency as a result. In virtue of the electrical balance duplexer 730, as we change the settings of the balance network impedance $Z_{BAL}$ 770, the antenna-to-RX path loss ideally does not change, allowing optimization towards minimal auxiliary RX output level. The tuning of the impedance network $Z_{BAL}$ 770 is performed by a digital processor 790, which may run an automated algorithm to optimize the isolation between the TX and RX at both frequencies. Instead of using a second auxiliary receive chain RXaux, another possible way would be to use a peak-detector 850 (a rectifier circuit) connected in parallel with the main RX chain, as shown in FIG. 8, in order to determine how much TX leakage is still left at TX frequencies. In virtue of the electrical balance duplexer 870, as we change the settings of the balance network impedance $Z_{BAL}$ 870, the antenna-to-RX path loss ideally does not change, allowing optimization towards minimal peak-detector output level. Similarly, when the peak-detector output is minimum, the balance network $Z_{BAL}$ 870 effectively provides electrical balance with the antenna impedance at the TX frequency.

For tuning the impedance network $Z_{BAL}$ 870 at the RX frequency, a measure of the received signal quality (a measure of integrity), for example the total error vector magnitude (EVM) of the RX, may be used. The digital processor optimizes the EVM to be as good as possible to suppress the TX noise leaking into the RX at the RX frequency. Thus, the better the EVM the lower the noise leakage into RX frequency—the balance network provides an impedance equal to that of the antenna at the RX frequency, and thus also the electrical balance duplexer provides TX-to-RX isolation at the RX frequency. After a digital baseband processing 880 of the wanted signal, an EVM measure is passed to the digital processor 890, which outputs a digital control signal ctrl to adjust the impedance $Z_{BAL}$ 870. As such, tuning at RX frequency should be done in a time frame where no packets are to be received, for example while the TX is transmitting the preamble (i.e. the header of the data packet). Another possible measure for tuning the impedance network at RX frequency is a test-signal generated by the TX at the RX frequency. The test signal should have a sufficient low power level (in order not to fail the transmit-mask as defined by the standard of operation). The amplitude of the RX output signal could then be sensed by the digital algorithm and used to optimize the balance network setting such that TX leakage from TX to RX is minimized and electrical balance is effectively provided with the antenna impedance at the RX frequency. This method implies that it is likely that no signal absorbed by the antenna 820 at RX frequencies, as the RX is likely completely desensitized to those signal levels, due to the TX operating at the same frequency.

In either of these use-cases, or other cases not depicted, the tunable impedance network 770 870 may instead act as a tunable RF band-pass filter if there are no tunable resistors present in the impedance structures. Tunable RF band-pass filters that can withstand high voltages and are very linear are desirable components. Moreover, their implementation in CMOS technology is highly desirable.

Embodiments of the present invention relate to an integrated circuit comprising the proposed tunable impedance network and a control circuit arranged for tuning the tunable network according to the described tuning method. The control circuit may be a processor arranged for executing the proposed method of tuning.

Figure 9:
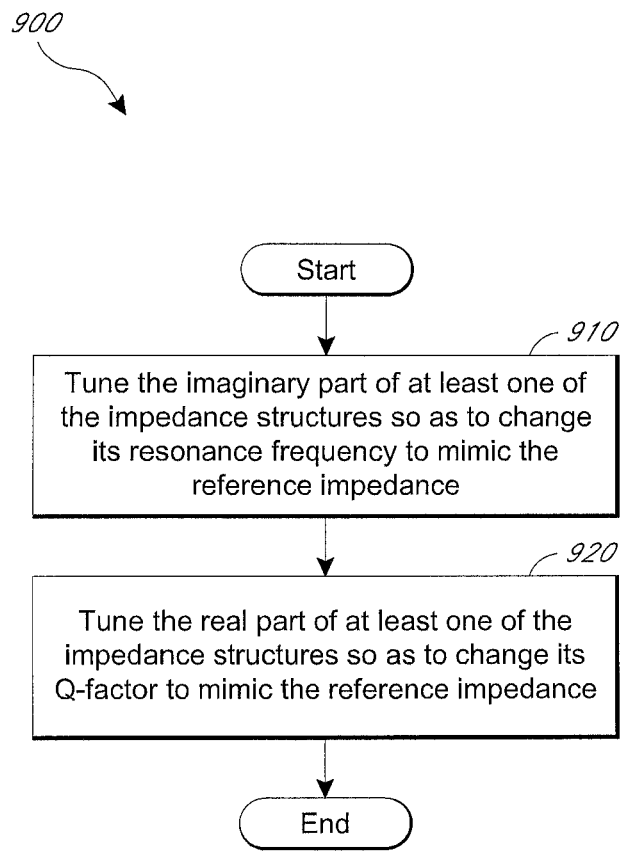
FIG. 9 is a flow chart illustrating a method of tuning the impedance of a tunable impedance network to a reference impedance having a real and imaginary part.

Tuning the impedance network shown in FIG. 5 will now be described with respect to FIG. 9, which is a flow chart illustrating a method of tuning the impedance of a tunable impedance network to a reference impedance having a real and imaginary part. At block 910, the control circuit 570 tunes the imaginary part of at least one of the impedance structures so as to change its resonance frequency to mimic the reference impedance. At block 920, the control circuit 570 tunes the imaginary part of at least one of the impedance structures so as to change its Q-factor to mimic the reference impedance.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments. It should be noted that the use of particular terminology when describing certain features or aspects of the invention should not be taken to imply that the terminology is being re-defined herein to be restricted to including any specific characteristics of the features or aspects of the invention with which that terminology is associated.

While various embodiments of the invention have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied, alone or in some combination, to one or more of the other embodiments of the disclosure, whether or not such embodiments are described, and whether or not such features are presented as being a part of a described embodiment. Thus the breadth and scope of the present disclosure should not be limited by any of the above-described exemplary embodiments.

It will be appreciated that, for clarity purposes, the above description has described embodiments with reference to different functional units. However, it will be apparent that any suitable distribution of functionality between different functional units may be used without detracting from the invention. For example, functionality illustrated to be performed by separate computing devices may be performed by the same computing device. Likewise, functionality illustrated to be performed by a single computing device may be distributed amongst several computing devices. Hence, references to specific functional units are only to be seen as references to suitable means for providing the described functionality, rather than indicative of a strict logical or physical structure or organization.

Embodiments of the present disclosure are described above and below with reference to flowchart and block diagram illustrations of methods, apparatus, and computer program products. It will be understood that each block of the flowchart illustrations, and combinations of blocks in the flowchart illustrations, can be implemented by execution of computer program instructions. These computer program instructions may be loaded onto a computer or other programmable data processing apparatus (such as a controller, microcontroller, microprocessor or the like) in a sensor electronics system to produce a machine, such that the instructions which execute on the computer or other programmable data processing apparatus create instructions for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks presented herein.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A tunable impedance network comprising:
   a plurality of transformers connected in series, each of the transformers having a primary winding and a secondary winding, each of the transformers configured to transform a voltage by a voltage transformation ratio of N:1 with N>1;
   a plurality of impedance structures, each of the impedance structures connected at the secondary winding of each of the transformers, each of the impedance structures configured to act as a resonant circuit together with the inductance of the secondary winding, wherein at least one of the impedance structures is a tunable passive network comprising at least one tunable resistor circuit and at least one tunable capacitor circuit, wherein each of the tunable resistor circuit and the tunable capacitor circuit comprise at least one transistor circuit.

2. The tunable impedance network of claim 1, further comprising a control circuit configured to tune the imaginary part of at least one of the impedance structures so as to change its resonance frequency to mimic a reference impedance, the control circuit further configured to tune the real part of at least one of the impedance structures so as to change its Q-factor to mimic the reference impedance.

3. The tunable impedance network of claim 1, wherein the at least one transistor circuit comprises a variable resistor or a variable capacitor.

4. The tunable impedance network of claim 1, wherein the at least one tunable resistor circuit comprises a bank of parallel switched resistors and the at least one tunable capacitor circuit comprises a bank of parallel switched capacitors, wherein the bank of parallel switched resistors comprises a first plurality of transistors configured as switches, wherein the bank of parallel switched capacitors comprises another plurality of transistors configured as switches.

5. The tunable impedance network of claim 1, wherein the impedance of at least one of the impedance structures has a real and an imaginary part.

6. The tunable impedance network of claim 1, wherein the tunable passive network comprises at least one series or parallel connected inductor.

7. The tunable impedance network of claim 1, wherein the transformation ratio is the same for each of the transformers.

8. The tunable impedance network of claim 1, wherein the impedance structures are equal for each of the transformers.

9. The tunable impedance network of claim 1, wherein at least one of the impedance structures is different from the other impedance structures.

10. The tunable impedance network of claim 1, wherein the at least one transistor circuit is implemented in CMOS technology.

11. An electrical balance duplexer comprising a tunable impedance network according to claim 1 configured to balance impedance with an antenna.

12. A circuit comprising:
    an antenna;
    a power amplifier; and
    a tunable impedance network according to claim 1 configured for antenna matching.

13. A tunable band-pass filter comprising a tunable impedance network according to claim 1 configured to band-pass filter over the outer terminals of the series of connected first windings.

14. A method of tuning the impedance of a tunable impedance network to a reference impedance having a real and imaginary part, the tunable impedance network comprising a plurality of transformers connected in series, each transformer having a primary winding and a secondary winding, the transformers having a voltage transformation ratio of N:1 with N>1, with connected at the secondary winding of each transformer an impedance structure acting as a resonant circuit together with the inductance of the secondary winding, at least one of the impedance structures being a tunable passive network comprising at least one tunable resistor circuit and at least one tunable capacitor circuit, wherein each of the tunable resistor circuit and the tunable capacitor circuit comprise at least one transistor circuit, the method comprising:
    tuning the imaginary part of at least one of the impedance structures so as to change its resonance frequency to mimic the reference impedance; and
    tuning the real part of at least one of the impedance structures so as to change its Q-factor to mimic the reference impedance.

15. The method of claim 14, wherein tuning comprises separately tuning different impedance structures.

16. The method of claim 14, comprising independently changing the resonance frequency and Q factor of the tunable impedance network.

17. Method according to claim 14, further comprising retuning the impedance structures during operation.

18. An integrated circuit comprising:
    a tunable impedance network comprising:
    a plurality of transformers connected in series, each of the transformers having a primary winding and a secondary winding, each of the transformers configured to transform a voltage by a voltage transformation ratio of N:1 with N>1;
    a plurality of impedance structures, each of the impedance structures connected at the secondary winding of each of the transformers, each of the impedance structures configured to act as a resonant circuit together with the inductance of the secondary winding, wherein the impedance structure is a tunable passive network comprising at least one tunable resistor circuit and at least one tunable capacitor circuit, wherein each of the tunable resistor circuit and the tunable capacitor circuit comprise at least one transistor circuit; and a processor configured to tune the tunable impedance network according to claim 14.

19. A tunable impedance network comprising:

a plurality of transformers connected in series each of the transformers having a primary winding and a secondary winding, each of the transformers configured to transform a voltage by a voltage transformation ratio of N:1 with N>1;

a plurality of impedance structures, each of the impedance structures connected at the secondary winding of each of the transformers, each of the impedance structures configured to act as a resonant circuit together with the inductance of the secondary winding, wherein at least one of the impedance structures is a tunable network comprising at least one tunable resistor circuit and at least one tunable capacitor circuit, wherein each of the tunable resistor circuit and the tunable capacitor circuit comprise at least one transistor circuit, wherein at least one of the impedance structures further comprises at least one active component.

20. A tunable impedance network comprising: means for transforming an input series of voltages to an output series of voltages by a voltage transformation ratio of N:1 with N>1, comprising a plurality of transformers; and means for tuning an impedance of each of a series of impedance structures of the transforming means, comprising a series of tunable passive networks, the means for tuning an impedance comprising: means for tuning the imaginary part of at least one of the impedance structures so as to change its resonance frequency to mimic a reference impedance, comprising a control circuit; and means for tuning the real part of at least one of the impedance structures so as to change its Q-factor to mimic the reference impedance, comprising the control circuit.

* * * * *

UNITED STATES PATENT AND TRADEMARK OFFICE
CERTIFICATE OF CORRECTION

| | | |
|---|---|---|
| PATENT NO. | : 9,548,715 B2 | Page 1 of 1 |
| APPLICATION NO. | : 14/109717 | |
| DATED | : January 17, 2017 | |
| INVENTOR(S) | : Barend Van Liempd et al. | |

It is certified that error appears in the above-identified patent and that said Letters Patent is hereby corrected as shown below:

On the Title Page

In Column 1 (page 2, item (56)) at Line 8, Under Other Publications, change "Mulitband" to --Multiband--.

In Column 1 (page 2, item (56)) at Line 11, Under Other Publications, change "Sytems"" to --Systems"--.

In the Claims

In Column 19 at Line 10, In Claim 19, change "series" to --series,--.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*